(12) United States Patent
Nannicini et al.

(10) Patent No.: US 11,775,721 B2
(45) Date of Patent: Oct. 3, 2023

(54) QUANTUM CIRCUIT DECOMPOSITION BY INTEGER PROGRAMMING

(71) Applicant: International Business Machines Corporation, Armonk, NY (US)

(72) Inventors: Giacomo Nannicini, New York, NY (US); John A. Gunnels, Somers, NY (US); Lior Horesh, North Salem, NY (US); Edwin Peter Dawson Pednault, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 4 days.

(21) Appl. No.: 17/382,741

(22) Filed: Jul. 22, 2021

(65) Prior Publication Data
US 2021/0350060 A1  Nov. 11, 2021

Related U.S. Application Data

(63) Continuation of application No. 15/920,714, filed on Mar. 14, 2018, now Pat. No. 11,093,679.

(51) Int. Cl.
*G06F 30/367* (2020.01)
*G06T 11/20* (2006.01)
*G06N 10/00* (2022.01)

(52) U.S. Cl.
CPC ........... *G06F 30/367* (2020.01); *G06N 10/00* (2019.01); *G06T 11/206* (2013.01)

(58) Field of Classification Search
CPC ...... G06F 30/367; G06N 10/00; G06T 11/206
See application file for complete search history.

(56) References Cited

U.S. PATENT DOCUMENTS

| | | | |
|---|---|---|---|
| 6,045,252 | A | 4/2000 | Pederson |
| 8,032,474 | B2 | 10/2011 | Macready et al. |
| 8,244,662 | B2 | 8/2012 | Coury et al. |
| 9,875,215 | B2 | 1/2018 | Macready et al. |
| 2006/0224547 | A1 | 10/2006 | Ulyanov et al. |
| 2017/0177544 | A1 | 6/2017 | Zaribafiyan et al. |

(Continued)

FOREIGN PATENT DOCUMENTS

WO  2010/148120 A2  12/2010

OTHER PUBLICATIONS

Berec, V. (2015). Phase space dynamics and control of the quantum particles associated to hypergraph states. In EPJ Web of Conferences (vol. 95, p. 04007). EDP Sciences. (Year: 2015).*

(Continued)

*Primary Examiner* — Bijan Mapar
(74) *Attorney, Agent, or Firm* — Amin, Turocy & Watson, LLP

(57) ABSTRACT

Techniques and a system for quantum circuit decomposition by integer programming are provided. In one example, a system includes a quantum circuit decomposition component and a simulation component. The quantum circuit decomposition component generates graphical data for a quantum circuit that is indicative of a graphical representation of the quantum circuit. The graphical representation is formatted as a hypergraph. The simulation component simulates the quantum circuit based on the graphical data associated with the hypergraph.

20 Claims, 10 Drawing Sheets

(56) References Cited

U.S. PATENT DOCUMENTS

2017/0185700 A1    6/2017  Narayanaswamy et al.
2018/0240035 A1*   8/2018  Scheer .................. H01L 39/223

OTHER PUBLICATIONS

Leier, "Evolution of Quantum Algorithms Using Genetic Programming," Dortmund, 2004, 199 pages.
Pednault, et al., "Breaking the 49-Qubit Barrier in the Simulation of Quantum Circuits," arXiv:1710.05867v1 [quantph] Oct. 16, 2017, 24 pages.
Markov, et al., "Simulating quantum computation by contracting tensor networks," arXivquant-ph/0511069v7 Jul. 12, 2009, 21 pages.
Boixo, et al., "Simulation of low-depth quantum circuits as complex undirected graphical models," arXiv:1712.05384v2 [quant-ph] Jan. 19, 2018, 12 pages.
International Search Report and Written Opinion received for PCT Application Serial No. PCT/EP2019/053660 dated May 17, 2019, 16 pages.
Pednault et al., "Breaking the 49-Qubit Barrier in the Simulation of Quantum Circuits", URL : https://arxiv.org/pdf/1710.05867.pdf, Dec. 11, 2018, pp. 1-29.
Kucar et al., "Hypergraph Partitioning Techniques", Copyright, vol. 11, No. 2-3a, Jan. 1, 2004, pp. 339-367.
Non-Final Office Action received for U.S. Appl. No. 15/920,714 dated May 14, 2020, 32 pages.
Non-Final Office Action received for U.S. Appl. No. 15/920,714 dated Nov. 25, 2020, 29 pages.
List of IBM Patents or Applications Treated as Related.

* cited by examiner

QUANTUM CIRCUIT DECOMPOSITION BY INTEGER PROGRAMMING

BACKGROUND

The subject disclosure relates to quantum circuits, and more specifically, to quantum circuit simulation. Quantum computing employs quantum physics to encode information rather than binary digital techniques based on transistors. For example, a quantum circuit can employ quantum bits (e.g., qubits) that operate according to a superposition principle of quantum physics and an entanglement principle of quantum physics. The superposition principle of quantum physics allows each qubit to represent both a value of "1" and a value of "0" at the same time. The entanglement principle of quantum physics states allows qubits in a superposition to be correlated with each other. For instance, a state of a first value (e.g., a value of "1" or a value of "0") can depend on a state of a second value. As such, a quantum circuit can employ qubits to encode information rather than binary digital techniques based on transistors. However, design of a quantum circuit is generally difficult and/or time consuming as compared to conventional binary digital devices. As such, a classical computing algorithm can be employed to simulate a quantum circuit. In one example, Markov et al., Simulating Quantum Computation by Contracting Tensor Networks discloses that "to simulate a quantum circuit, one may use a naive brute-force calculation of quantum amplitudes that has exponential overhead." However, simulation of a quantum circuit can be improved.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products for facilitating quantum circuit decomposition by integer programming are described.

According to an embodiment, a system can comprise a quantum circuit decomposition component and a simulation component. The quantum circuit decomposition component can generate graphical data for a quantum circuit that is indicative of a graphical representation of the quantum circuit. The graphical representation can be formatted as a hypergraph. The simulation component can simulate the quantum circuit based on the graphical data associated with the hypergraph. In an embodiment, the system can reduce a memory requirement for a simulation process associated with the quantum circuit and/or the system can reduce an amount of computational resources employed to simulate the quantum circuit. In certain embodiments, the quantum circuit decomposition component can generate a set of sub-circuits for the quantum circuit based on the graphical data associated with the hypergraph. In another embodiment, the simulation component can simulate the set of sub-circuits. In yet another embodiment, a node of the hypergraph can represent a tensor associated with the quantum circuit. In yet another embodiment, a hyperedge of the hypergraph can represent an index label for the tensor. In certain embodiments, the quantum circuit decomposition component can partition the hypergraph based on a computation sequence for a simulation process associated with the quantum circuit. In certain embodiments, the quantum circuit decomposition component can perform integer programming optimization to generate a set of sub-circuits for the quantum circuit. In another embodiment, the simulation component can determine a memory requirement for a simulation process associated with the quantum circuit based on analysis of the graphical data. In yet another embodiment, the simulation component can simulate a first portion of the hypergraph and a second portion of the hypergraph in parallel in response to a determination that the first portion of the hypergraph and the second portion of the hypergraph are included in a corresponding computation sequence for a simulation process associated with the quantum circuit. In yet another embodiment, the simulation component can simulate the quantum circuit based on the graphical data associated with the hypergraph to reduce an amount of processing for a simulation process associated with the quantum circuit.

According to another embodiment, a computer-implemented method is provided. The computer-implemented method can comprise generating, by a system operatively coupled to a processor, graphical data for a quantum circuit indicative of a graphical representation of the quantum circuit that is formatted as a hypergraph. The computer-implemented method can also comprise generating, by the system, a set of sub-circuits for the quantum circuit based on the hypergraph. Furthermore, the computer-implemented method can comprise simulating, by the system, the set of sub-circuits for the quantum circuit. In an embodiment, the system can reduce a memory requirement for a simulation process associated with the quantum circuit and/or the system can reduce an amount of computational resources employed to simulate the quantum circuit. In certain embodiments, the generating the graphical data can comprise converting tensor data indicative of information for a tensor network representative of the quantum circuit into the graphical data. In another embodiment, the generating the graphical data can comprise representing a gate of the quantum circuit as a node in the hypergraph. In yet another embodiment, the generating the graphical data can comprise representing a connection of the quantum circuit as a hyperedge in the hypergraph. In certain embodiments, the generating the set of sub-circuits can comprise performing an integer programming process associated with the graphical data. In certain embodiments, the generating the set of sub-circuits can comprise reducing an amount of processing for a simulation process associated with the quantum circuit.

According to yet another embodiment, a computer program product for quantum computing simulation can comprise a computer readable storage medium having program instructions embodied therewith. The program instructions can be executable by a processor and cause the processor to generate, by the processor, graphical data for a quantum circuit indicative of a graphical representation of the quantum circuit that is formatted as a hypergraph. The program instructions can also cause the processor to generate, by the processor, a set of sub-circuits for the quantum circuit based on the hypergraph. Furthermore, the program instructions can cause the processor to simulate, by the processor, the set of sub-circuits for the quantum circuit. In an embodiment, the computer program product can reduce a memory requirement for a simulation process associated with the quantum circuit and/or the system can reduce an amount of computational resources employed to simulate the quantum circuit. In certain embodiments, the program instructions can also cause the processor to configure, by the processor, a node in the hypergraph to represent a gate of the quantum circuit. In certain embodiments, the program instructions can also cause the processor to configure, by the processor, a hyperedge in the hypergraph to represent a connection of the quantum circuit.

According to yet another embodiment, a system can comprise a quantum circuit decomposition component and a simulation component. The quantum circuit decomposition component can generate graphical data for a quantum circuit and generates a set of sub-circuits for the quantum circuit based on the graphical data. The graphical data can be indicative of a graphical representation of the quantum circuit that is formatted as a hypergraph. The simulation component can simulate the set of sub-circuits associated with the hypergraph. In an embodiment, the system can reduce a memory requirement for a simulation process associated with the quantum circuit and/or the system can reduce an amount of computational resources employed to simulate the quantum circuit. In certain embodiments, a node of the hypergraph represents a gate associated with the quantum circuit. In certain embodiments, a hyperedge of the hypergraph represents a connection associated with the quantum circuit.

According to yet another embodiment, a computer program product for quantum computing simulation can comprise a computer readable storage medium having program instructions embodied therewith. The program instructions can be executable by a processor and cause the processor to generate, by the processor, graphical data for a quantum circuit that is indicative of a graphical representation of the quantum circuit. The graphical representation can be formatted as a hypergraph. The program instructions can also cause the processor to simulate, by the processor, the quantum circuit based on the graphical data associated with the hypergraph. In an embodiment, the computer program product can reduce a memory requirement for a simulation process associated with the quantum circuit and/or the system can reduce an amount of computational resources employed to simulate the quantum circuit. In certain embodiments, the program instructions can also cause the processor to generate, by the processor, a set of sub-circuits for the quantum circuit based on the graphical data associated with the hypergraph.

DETAILED DESCRIPTION

Figure 1:
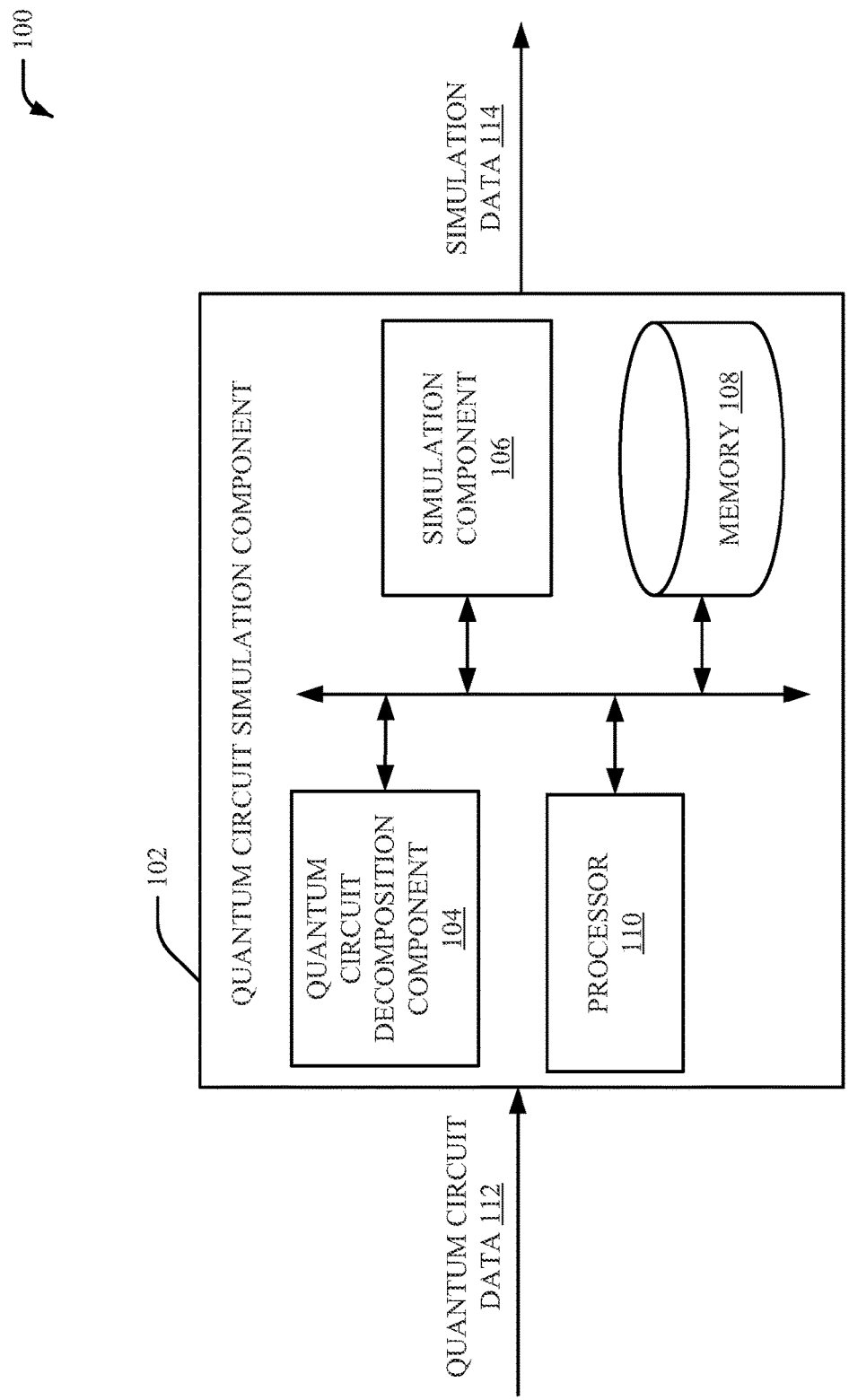
FIG. 1 illustrates a block diagram of an example, non-limiting system that includes a quantum circuit simulation component in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing employs quantum physics to encode information rather than binary digital techniques based on transistors. For example, a quantum circuit can employ quantum bits (e.g., qubits) that operate according to a superposition principle of quantum physics and an entanglement principle of quantum physics. The superposition principle of quantum physics allows each qubit to represent both a value of "1" and a value of "0" at the same time. The entanglement principle of quantum physics states allows qubits in a superposition to be correlated with each other. For instance, a state of a first value (e.g., a value of "1" or a value of "0") can depend on a state of a second value. As such, a quantum circuit can employ qubits to encode information rather than binary digital techniques based on transistors. However, design of a quantum circuit is generally difficult and/or time consuming as compared to conventional binary digital devices. As such, simulation of a quantum circuit can be improved.

To address these and/or other issues, embodiments described herein include systems, computer-implemented methods, and computer program products for improved quantum circuit simulation. In an aspect, quantum circuit decomposition by integer programming can be employed to simulate a quantum circuit. For example, quantum circuit decomposition by integer programming can be employed as part of a process to simulate a quantum circuit. Quantum circuit decomposition can include generating a set of sub-circuits for the quantum circuit. In an embodiment, the quantum circuit can be graphically represented as a hypergraph to facilitate quantum circuit decomposition. For example, a node of the hypergraph can represent a tensor associated with a gate of the quantum circuit. Furthermore, a hyperedge of the hypergraph can represent an index label associated with one or more connections of the quantum circuit. In another embodiment, integer programming can be employed to optimize quantum circuit decomposition of a quantum circuit. For instance, integer programming can be employed to minimize an amount of memory utilized during quantum circuit decomposition. In certain embodiments, the hypergraph can include an output node that indicates which wires of a quantum circuit are open to for example, construct input data for the integer programming Integer programming can include converting the hypergraph into a mathematical optimization model that can be provided as input to an optimization software associated with integer programming In another embodiment, quantum circuit decomposition can be incorporated into a quantum simulation process to, for example, maximize a circuit volume of a quantum circuit that can be simulated by hardware (e.g., a processor). In an embodiment, memory cost associated with decomposition of a quantum circuit can be computed to satisfy one or more consistency criterion. In another embodiment, an integer programming model can determine a circuit decomposition for a quantum circuit that is optimal according to specified criterion (e.g., an object function). As such, an amount of time to simulate a quantum circuit can be reduced. Furthermore, an amount of computational resources employed to simulate a quantum circuit can be reduced. Simulation of a quantum circuit can also be optimized. Additionally, accuracy of a quantum circuit system and/or efficiency of a quantum circuit system can be improved. Moreover, quality of a quantum circuit can be improved, performance a quantum circuit can be improved, efficiency of a quantum circuit can be improved, timing characteristics of a quantum circuit can be improved, power characteristics of a quantum circuit can be improved, and/or another characteristic of a quantum circuit can be improved.

FIG. 1 illustrates a block diagram of an example, non-limiting system 100 for quantum circuit simulation in accordance with one or more embodiments described herein. In various embodiments, the system 100 can be a quantum circuit simulation system associated with technologies such as, but not limited to, quantum circuit technologies, quantum circuit simulation technologies, quantum computing design technologies, qubit technologies, quantum circuit modeling technologies, quantum circuit technologies, quantum processor technologies, artificial intelligence technologies and/or other technologies. The system 100 can employ hardware and/or software to solve problems that are highly technical in nature, that are not abstract and that cannot be performed as a set of mental acts by a human. Further, in certain embodiments, some of the processes performed may be performed by one or more specialized computers (e.g., one or more specialized processing units, a specialized computer with a quantum circuit simulation component, etc.) for carrying out defined tasks related to quantum circuit simulation. The system 100 and/or components of the system 100 can be employed to solve new problems that arise through advancements in technologies mentioned above, computer architecture, and/or the like. One or more embodiments of the system 100 can provide technical improvements to quantum circuit simulation systems, quantum circuit systems, quantum computing design systems, qubit systems, quantum circuit modeling systems, quantum circuit systems, quantum processor systems, artificial intelligence systems, and/or other systems. One or more embodiments of the system 100 can also provide technical improvements to a quantum circuit (e.g., a quantum processor) by improving processing performance of the quantum circuit, improving processing efficiency of the quantum circuit, improving processing characteristics of the quantum circuit, improving timing characteristics of the quantum circuit and/or improving power efficiency of the quantum circuit.

In the embodiment shown in FIG. 1, the system 100 can include a quantum circuit simulation component 102. As shown in FIG. 1, the quantum circuit simulation component 102 can include a quantum circuit decomposition component 104 and a simulation component 106. Aspects of the quantum circuit simulation component 102 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the quantum circuit simulation component 102 can also include memory 108 that stores computer executable components and instructions. Furthermore, the quantum circuit simulation component 102 can include a processor 110 to facilitate execution of the instructions (e.g., computer executable components and corresponding instructions) by the quantum circuit simulation component 102. As shown, the quantum circuit decomposition component 104, the simulation component 106, the memory 108 and/or the processor 110 can be electrically and/or communicatively coupled to one another in one or more embodiments.

The quantum circuit simulation component 102 (e.g., the quantum circuit decomposition component 104 of the quantum circuit simulation component 102) can receive quantum circuit data 112. The quantum circuit data 112 can be, for example, a machine-readable description of a quantum circuit. The quantum circuit can be a model for one or more quantum computations associated with a sequence of quantum gates. In one example, the quantum circuit data 112 can include textual data indicative of a text-format language (e.g., a QASM text-format language) that describes a quantum circuit. For instance, the textual data can, for example, textually describe one or more qubit gates of a quantum circuit associated with one or more qubits. In an embodiment, the quantum circuit data 112 can additionally include marker data indicative of information for one or more marker elements that tag one or more locations associated with a quantum circuit. For example, the marker data can include one or more marker elements that tag a location of one or more qubit gates of a quantum circuit associated with one or more qubits. The quantum circuit can be a machine that performs a set of calculations based on principle of quantum physics. For example, the quantum circuit can encode information using qubits. In one embodiment, the quantum circuit can be a quantum processor (e.g., a hardware quantum processor). For example, the quantum circuit can be a quantum processor that executes a set of instruction threads associated with data.

The quantum circuit decomposition component 104 can generate graphical data for the quantum circuit associated with the quantum circuit data 112. The graphical data can be indicative of a graphical representation of the quantum circuit associated with the quantum circuit data 112. In an embodiment, the graphical representation can be formatted as a hypergraph. For example, the quantum circuit decomposition component 104 can graphically represent the quantum circuit associated with the quantum circuit data 112 as a hypergraph. The hypergraph for the quantum circuit associated with the quantum circuit data 112 can include a set of nodes and a set of hyperedges. The set of nodes can be a set of vertices (e.g., a set of points) of the hypergraph. The set of hyperedges can be a set of edges that connect two or more nodes from the set of nodes. In an aspect, a node of the hypergraph can represent a tensor associated with the quantum circuit (e.g., the quantum circuit associated with the quantum circuit data 112). For example, a gate of the quantum circuit associated with the quantum circuit data 112 can be represented as a node associated with a tensor in the hypergraph. A tensor can be an element of a tensor product of a finite number of vector spaces over a common field. As such, a tensor can be a multilinear map for a gate of the quantum circuit associated with the quantum circuit data 112. In an aspect, the quantum circuit decomposition component 104 can convert tensor data indicative of information for a tensor network representative of the quantum circuit into the graphical data. For instance, the tensor network can be a set of tensors where at least a portion of indices for the set of tensors are modified based on a defined pattern. The tensor network can, for example, be represented as an undirected graph where a node corresponds to a tensor and an edge represents a reduction among common indices of connected nodes. In an example, a tensor network can represent a quantum circuit on q qubits with depth D.

In an embodiment, the quantum circuit decomposition component 104 can partition the hypergraph based on information associated with a simulation process for the quantum circuit. For instance, the quantum circuit decomposition component 104 can partition the set of nodes and/or the set of hyperedges based on information associated with a simulation process for the quantum circuit. Additionally or alternatively, the quantum circuit decomposition component 104 can partition the hypergraph based on information associated with hardware (e.g., a processor) and/or memory employed during a simulation process for the quantum circuit. For instance, the quantum circuit decomposition component 104 can partition the set of nodes and/or the set of hyperedges based on information associated with hardware (e.g., a processor) and/or memory employed during a simulation process for the quantum circuit. In an example, the quantum circuit decomposition component 104 can partition the hypergraph based on a computation sequence for a simulation process associated with the quantum circuit. In another example, the quantum circuit decomposition component 104 can alter a visualization index (e.g., RGB index) of a tensor associated with the hypergraph based on a computation sequence for a simulation process associated with the quantum circuit.

The simulation component 106 can simulate the quantum circuit based on the graphical data associated with the hypergraph. For instance, the simulation component 106 can perform one or more simulation processes for the quantum circuit based on the graphical data associated with the hypergraph. In certain embodiments, the simulation component 106 can perform a first simulation process associated with first graphical data that corresponds to a first portion of the hypergraph (e.g., a first sub-circuit), the simulation component 106 can perform a second simulation process associated with second graphical data that corresponds to a second portion of the hypergraph (e.g., a second sub-circuit), etc. In an aspect, the simulation component 106 can determine one or more memory requirements for one or more simulation processes associated with the quantum circuit based on analysis of the graphical data. Furthermore, the simulation component 106 can perform the one or more simulation processes for the quantum circuit based on the one or more memory requirements. In one example, the simulation component 106 can perform a first simulation process associated with first graphical data that corresponds to a first portion of the hypergraph based on a first memory requirement, the simulation component 106 can perform a second simulation process associated with second graphical data that corresponds to a second portion of the hypergraph based on a second memory requirement, etc. In certain embodiments, the simulation component 106 can simulate a first portion of the hypergraph and a second portion of the hypergraph in parallel in response to a determination that the first portion of the hypergraph and the second portion of the hypergraph are included in a corresponding computation sequence for a simulation process associated with the quantum circuit. In an embodiment, the quantum circuit decomposition component 104 can generate a set of sub-circuits from the quantum circuit associated with the quantum circuit data 112. For instance, the quantum circuit decomposition component 104 can generate the set of sub-circuits for the quantum circuit based on the graphical data associated with the hypergraph. In an aspect, the quantum circuit decomposition component 104 can perform an integer programming process (e.g., integer programming optimization) to generate the set of sub-circuits for the quantum circuit associated with the quantum circuit data 112. Furthermore, the simulation component 106 can simulate the set of sub-circuits based on one or more simulation processes. For example, the simulation component 106 can perform a first simulation process associated with a first sub-circuit that corresponds to a first portion of the hypergraph, the simulation component 106 can perform a second simulation process associated with a second sub-circuit that corresponds to a second portion of the hypergraph, etc. The simulation component 106 can generate simulation data 114 based on one or more simulation processes. For instance, the simulation data 114 can include simulation results for the quantum circuit associated with the quantum circuit data 112. In one example, the simulation data 114 can include an electrical characterization and/or a mechanical characterization for the quantum circuit associated with the quantum circuit data 112. In another example, the simulation data 114 can include design data indicative of hardware design information for the quantum circuit associated with the quantum circuit data 112. In yet another example, the simulation data 114 can include model data indicative of one or more models for one or more characterizations for the quantum circuit associated with the quantum circuit data 112.

In certain embodiments, the simulation component 106 can generate the simulation data 114 based on classifications, correlations, inferences and/or expressions associated with principles of artificial intelligence. For instance, the simulation component 106 can employ an automatic classification system and/or an automatic classification process to generate the simulation data 114. In one example, the simulation component 106 can employ a probabilistic and/or statistical-based analysis (e.g., factoring into the analysis utilities and costs) to learn and/or generate inferences with respect to the simulation data 114. In an aspect, the simulation component 106 can include an inference component (not shown) that can further enhance aspects of the simulation component 106 utilizing in part inference based schemes to facilitate learning and/or generating inferences associated with the simulation data 114. The simulation component 106 can employ any suitable machine-learning based techniques, statistical-based techniques and/or probabilistic-based techniques. For example, the simulation component 106 can employ expert systems, fuzzy logic, SVMs, Hidden Markov Models (HMMs), greedy search algorithms, rule-based systems, Bayesian models (e.g., Bayesian networks), neural networks, other non-linear training techniques, data fusion, utility-based analytical systems, systems employing Bayesian models, etc. In another aspect, the simulation component 106 can perform a set of machine learning computations associated with generation of the simulation data 114. For example, the simulation component 106 can perform a set of clustering machine learning computations, a set of logistic regression machine learning computations, a set of decision tree machine learning computations, a set of random forest machine learning computations, a set of regression tree machine learning computations, a set of least square machine learning computations, a set of instance-based machine learning computations, a set of regression machine learning computations, a set of support vector regression machine learning computations, a set of k-means machine learning computations, a set of spectral clustering machine learning computations, a set of rule learning machine learning computations, a set of Bayesian machine learning computations, a set of deep Boltzmann machine computations, a set of deep belief network computations, and/or a set of different machine learning computations to generate the simulation data 114.

It is to be appreciated that the quantum circuit simulation component 102 (e.g., the quantum circuit decomposition component 104 and/or the simulation component 106) performs a quantum circuit decomposition process and/or one or more simulation processes that cannot be performed by a human (e.g., is greater than the capability of a single human mind). For example, an amount of data processed, a speed of data processed and/or data types of data processed by the quantum circuit simulation component 102 (e.g., the quantum circuit decomposition component 104 and/or the simulation component 106) over a certain period of time can be greater, faster and different than an amount, speed and data type that can be processed by a single human mind over the same period of time. The quantum circuit simulation component 102 (e.g., the quantum circuit decomposition component 104 and/or the simulation component 106) can also be fully operational towards performing one or more other functions (e.g., fully powered on, fully executed, etc.) while also performing the above-referenced quantum circuit decomposition process and/or one or more simulation processes. Moreover, graphical data and/or simulation data 114 generated by the quantum circuit simulation component 102 (e.g., the quantum circuit decomposition component 104 and/or the simulation component 106) can include information that is impossible to obtain manually by a user. For example, a type of information included in the graphical data and/or simulation data 114, and/or a variety of information included in the graphical data and/or simulation data 114 can be more complex than information obtained manually by a user.

Additionally, it is to be appreciated that the system 100 can provide various advantages as compared to conventional simulation techniques for a quantum circuit. For instance, an amount of time to simulate a quantum circuit can be reduced by employing the system 100. Furthermore, an amount of computational resources employed to simulate a quantum circuit can be reduced by employing the system 100. A design of a quantum circuit can also be optimized by employing the system 100. Additionally, accuracy of a quantum circuit simulation and/or efficiency of quantum circuit simulation can be improved. Moreover, quality of a quantum circuit can be improved, performance a quantum circuit can be improved, efficiency of a quantum circuit can be improved, timing characteristics of a quantum circuit can be improved, power characteristics of a quantum circuit can be improved, and/or another characteristic of a quantum circuit can be improved by employing the system 100.

Figure 2:
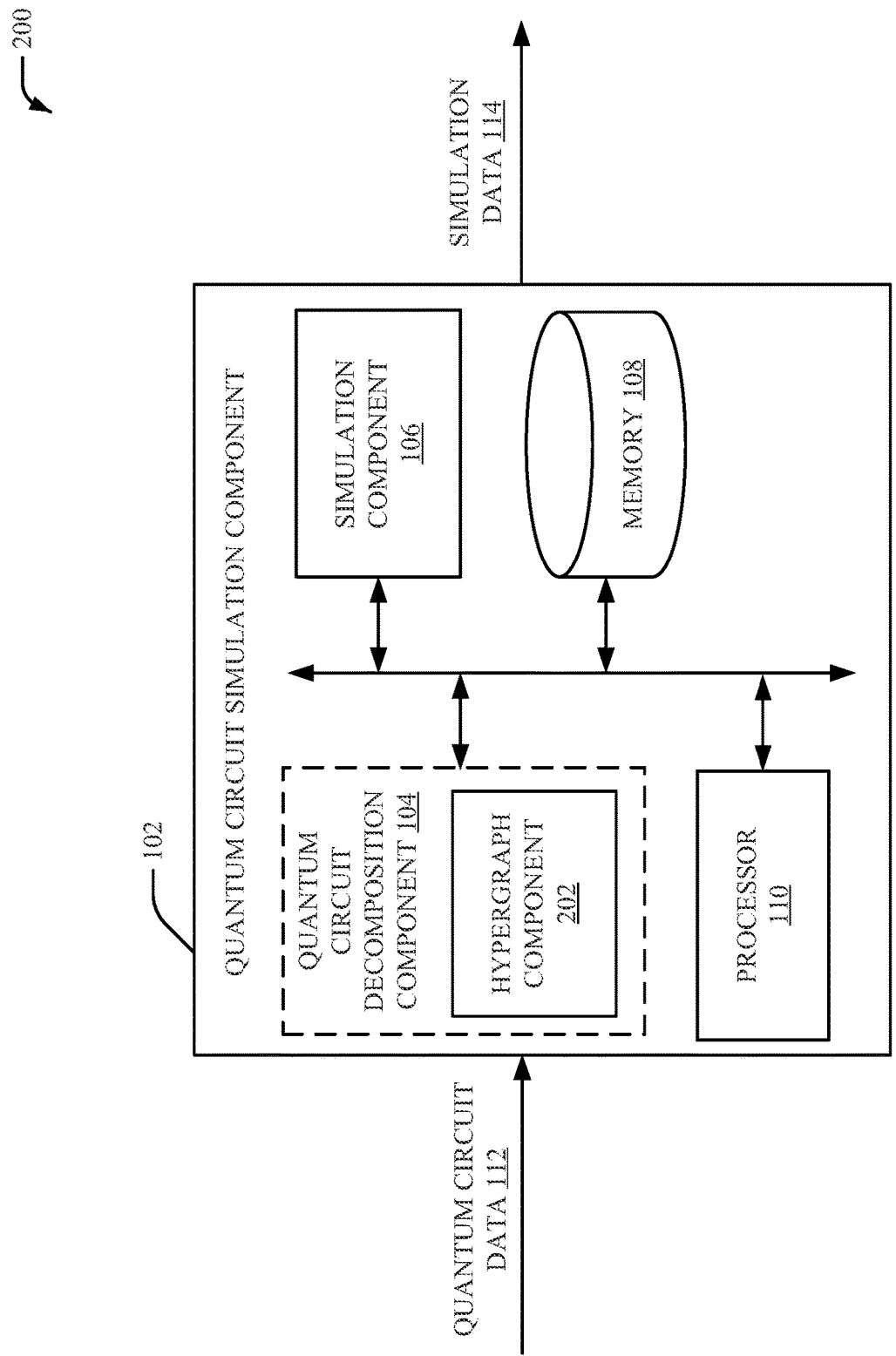
FIG. 2 illustrates a block diagram of another example, non-limiting system that includes a quantum circuit simulation component in accordance with one or more embodiments described herein.

FIG. 2 illustrates a block diagram of an example, non-limiting system 200 in accordance with one or more embodiments described herein. Repetitive description of like elements employed in other embodiments described herein is omitted for sake of brevity.

The system 200 includes the quantum circuit simulation component 102. The quantum circuit simulation component 102 shown in FIG. 2 can include the quantum circuit decomposition component 104, the simulation component 106, the memory 108, and/or the processor 110. The quantum circuit decomposition component 104 can include a hypergraph component 202. The hypergraph component 202 can generate hypergraph data for the quantum circuit associated with the quantum circuit data 112. The hypergraph data can be indicative of a hypergraph representation of the quantum circuit associated with the quantum circuit data 112. For example, the hypergraph component 202 can graphically represent the quantum circuit associated with the quantum circuit data 112 as a hypergraph. The hypergraph data can include a set of nodes and a set of hyperedges for the hypergraph. The set of nodes can be a set of vertices (e.g., a set of points) of the hypergraph. The set of hyperedges can be a set of edges that connect two or more nodes from the set of nodes. In an aspect, a node of the hypergraph can represent a tensor associated with the quantum circuit (e.g., the quantum circuit associated with the quantum circuit data 112). For example, a gate of the quantum circuit associated with the quantum circuit data 112 can be represented as a node associated with a tensor in the hypergraph. A tensor can be an element of a tensor product of a finite number of vector spaces over a common field. As such, a tensor can be a multilinear map for a gate of the quantum circuit associated with the quantum circuit data 112. In an aspect, the hypergraph component 202 can convert tensor data indicative of information for a tensor network representative of the quantum circuit into the hypergraph data. For instance, the tensor network can be a set of tensors where at least a portion of indices for the set of tensors are modified based on a defined pattern. The tensor network can, for example, be represented as an undirected graph where a node corresponds to a tensor and an edge represents a reduction among common indices of connected nodes.

It is to be appreciated that the system 200 can provide various advantages as compared to conventional simulation techniques for a quantum circuit. For instance, an amount of time to simulate a quantum circuit can be reduced by employing the system 200. Furthermore, an amount of computational resources employed to simulate a quantum circuit can be reduced by employing the system 200. A design of a quantum circuit can also be optimized by employing the system 200. Additionally, accuracy of a quantum circuit simulation and/or efficiency of quantum circuit simulation can be improved. Moreover, quality of a quantum circuit can be improved, performance a quantum circuit can be improved, efficiency of a quantum circuit can be improved, timing characteristics of a quantum circuit can be improved, power characteristics of a quantum circuit can be improved, and/or another characteristic of a quantum circuit can be improved by employing the system 200.

Figure 3:
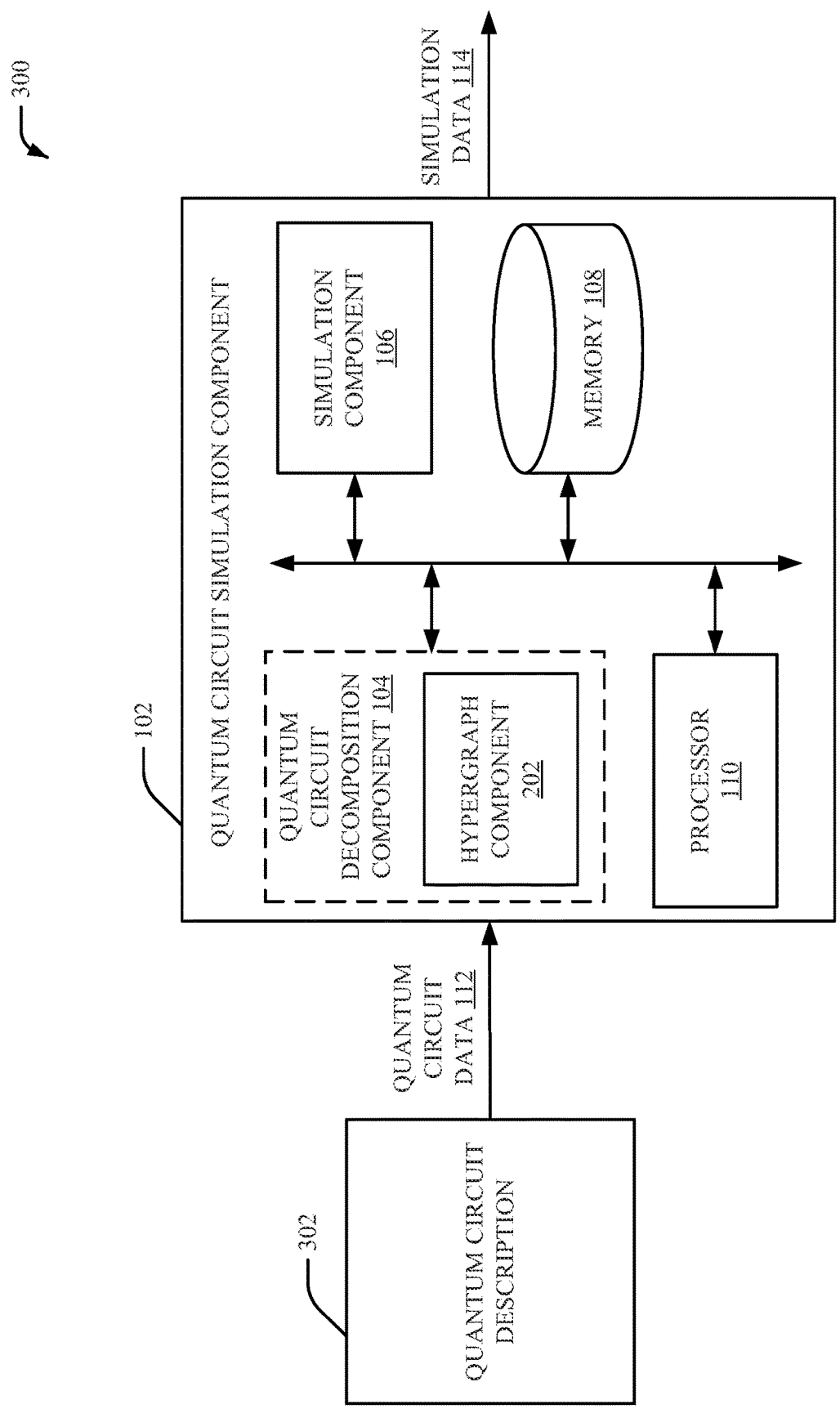
FIG. 3 illustrates a block diagram of yet another example, non-limiting system that includes a quantum circuit simulation component and a quantum circuit description in accordance with one or more embodiments described herein.

FIG. 3 illustrates a block diagram of an example, non-limiting system 300 in accordance with one or more embodiments described herein. Repetitive description of like elements employed in other embodiments described herein is omitted for sake of brevity.

The system 300 includes the quantum circuit simulation component 102 and a quantum circuit description 302. The quantum circuit simulation component 102 shown in FIG. 3 can include the quantum circuit decomposition component 104, the simulation component 106, the memory 108, and/or the processor 110. In an embodiment, the quantum circuit decomposition component 104 can include the hypergraph component 202. The quantum circuit description 302 can be a description of a machine that performs a set of calculations based on principle of quantum physics. For example, the quantum circuit description 300 can be associated with a text-format language (e.g., a QASM text-format language) that describes a quantum circuit. In an aspect, a quantum circuit associated with the quantum circuit description 302 can encode and/or process information using qubits. In one embodiment, a quantum circuit associated with the quantum circuit description 302 can be a quantum processor (e.g., a hardware quantum processor) that can encode and/or process information using qubits. For instance, a quantum circuit associated with the quantum circuit description 302 can be a hardware quantum processor that executes a set of instruction threads associated with qubits. In another embodiment, a quantum circuit associated with the quantum circuit description 302 can be a qubit device and/or a qubit unit cell that can encode and/or process information using qubits. For instance, a quantum circuit associated with the quantum circuit description 302 can be a qubit device and/or a qubit unit cell that executes a set of instruction threads associated with qubits. In an aspect, the quantum circuit description 302 can include one or more quantum elements. The one or more quantum elements can include, for example, a qubit element of a quantum circuit associated with the quantum circuit description 302, a coupler of a quantum circuit associated with the quantum circuit description 302, a readout of a quantum circuit associated with the quantum circuit description 302, a bus of a quantum circuit associated with the quantum circuit description 302, and/or another quantum element of a quantum circuit associated with the quantum circuit description 302.

It is to be appreciated that the system 300 can provide various advantages as compared to conventional simulation techniques for a quantum circuit. For instance, an amount of time to simulate a quantum circuit can be reduced by employing the system 300. Furthermore, an amount of computational resources employed to simulate a quantum circuit can be reduced by employing the system 300. A design of a quantum circuit can also be optimized by employing the system 300. Additionally, accuracy of a quantum circuit simulation and/or efficiency of quantum circuit simulation can be improved. Moreover, quality of a quantum circuit can be improved, performance a quantum circuit can be improved, efficiency of a quantum circuit can be improved, timing characteristics of a quantum circuit can be improved, power characteristics of a quantum circuit can be improved, and/or another characteristic of a quantum circuit can be improved by employing the system 300.

Figure 4:
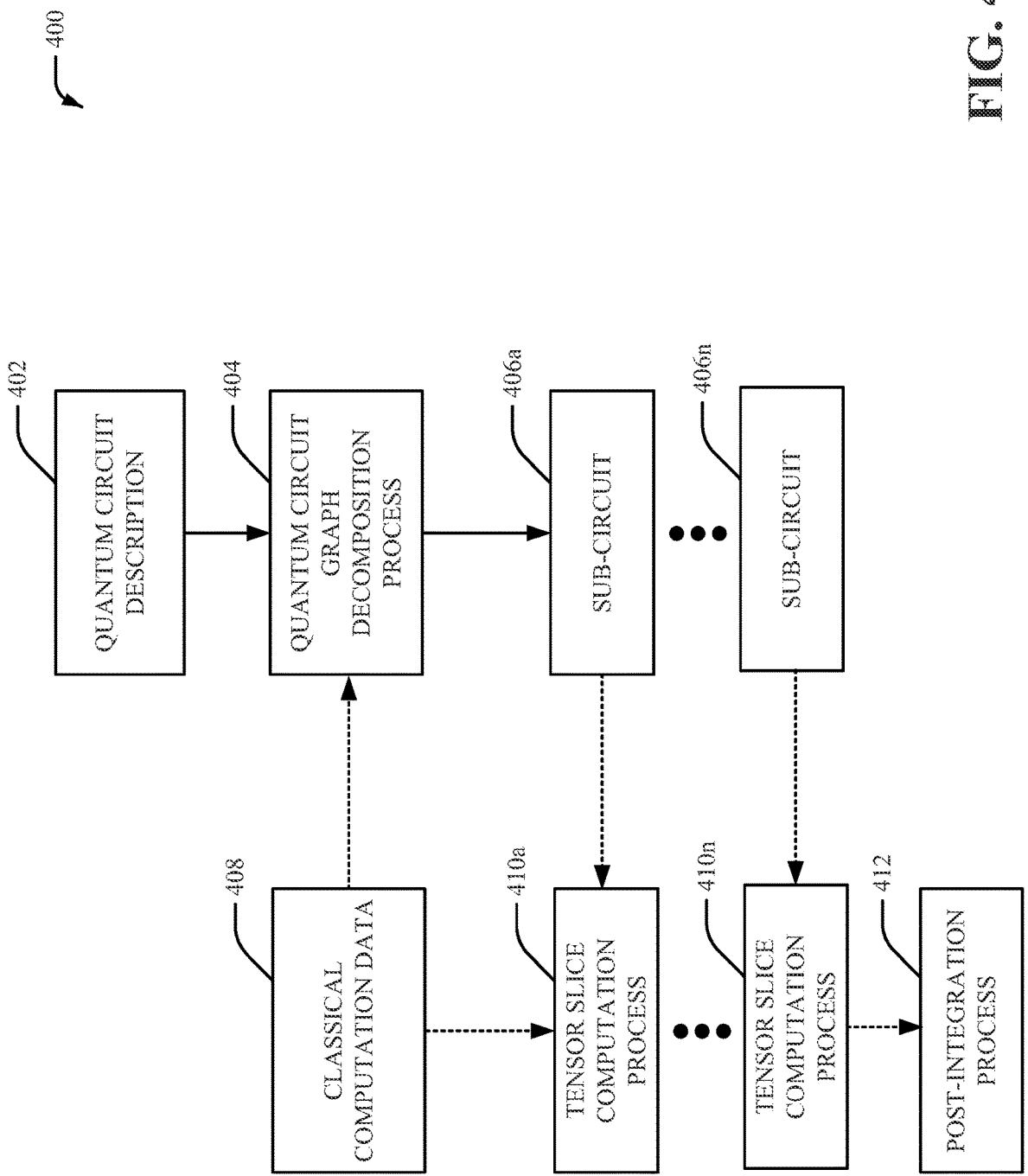
FIG. 4 illustrates an example, non-limiting system associated with quantum circuit decomposition in accordance with one or more embodiments described herein.

FIG. 4 illustrates a block diagram of an example, non-limiting system 400 in accordance with one or more embodiments described herein. Repetitive description of like elements employed in other embodiments described herein is omitted for sake of brevity.

The system 400 can include a quantum circuit description 402. In an embodiment, the quantum circuit description 402 can correspond to the quantum circuit description 302. The quantum circuit description 402 can be a description of a machine that performs a set of calculations based on principle of quantum physics. For example, the quantum circuit description 402 can be associated with a text-format language (e.g., a QASM text-format language) that describes a quantum circuit. In an aspect, a quantum circuit associated with the quantum circuit description 402 can encode and/or process information using qubits. In one embodiment, a quantum circuit associated with the quantum circuit description 402 can be a quantum processor (e.g., a hardware quantum processor) that can encode and/or process information using qubits. For instance, a quantum circuit associated with the quantum circuit description 402 can be a hardware quantum processor that executes a set of instruction threads associated with qubits. In another embodiment, a quantum circuit associated with the quantum circuit description 402 can be a qubit device and/or a qubit unit cell that can encode and/or process information using qubits. For instance, a quantum circuit associated with the quantum circuit description 402 can be a qubit device and/or a qubit unit cell that executes a set of instruction threads associated with qubits. In an aspect, the quantum circuit description 402 can include one or more quantum elements. The one or more quantum elements can include, for example, a qubit element of a quantum circuit associated with the quantum circuit description 402, a coupler of a quantum circuit associated with the quantum circuit description 402, a readout of a quantum circuit associated with the quantum circuit description 402, a bus of a quantum circuit associated with the quantum circuit description 402, and/or another quantum element of a quantum circuit associated with the quantum circuit description 402.

A quantum circuit graph decomposition process 404 can be performed based on the quantum circuit description 402. The quantum circuit graph decomposition process 404 can be performed, for example, by the quantum circuit decomposition component 104. In an embodiment, the quantum circuit graph decomposition process 404 can generate graphical data for the quantum circuit description 402. The graphical data can be indicative of a graphical representation of the quantum circuit description 402. Furthermore, the graphical representation can be formatted as a hypergraph. For example, the quantum circuit graph decomposition process 404 can graphically represent the quantum circuit description 402 as a hypergraph. In an aspect, the graphical data can include hypergraph data. The hypergraph data can be indicative of a hypergraph representation of the quantum circuit description 402. In another aspect, the quantum circuit graph decomposition process 404 can generate a set of nodes and a set of hyperedges for the hypergraph. The set of nodes can be a set of vertices (e.g., a set of points) of the hypergraph. The set of hyperedges can be a set of edges that connect two or more nodes from the set of nodes. In one example, a node of the hypergraph can represent a tensor associated with the quantum circuit description 402. For instance, a gate of the quantum circuit description 402 can be represented as a node associated with a tensor in the hypergraph. A tensor can be an element of a tensor product of a finite number of vector spaces over a common field. As such, a tensor can be a multilinear map for a gate of the quantum circuit description 402. In certain embodiments, the quantum circuit graph decomposition process 404 can convert tensor data indicative of information for a tensor network representative of the quantum circuit description 402 into the hypergraph data. For instance, the tensor network can be a set of tensors where at least a portion of indices for the set of tensors are modified based on a defined pattern. The tensor network can, for example, be represented as an undirected graph where a node corresponds to a tensor and an edge represents a reduction among common indices of connected nodes.

In an embodiment, the quantum circuit graph decomposition process 404 can generate a set of sub-circuits 406a-n for the quantum circuit description 402. For instance, the quantum circuit graph decomposition process 404 can generate the set of sub-circuits 406*a-n* for the quantum circuit description 402 based on the graphical data associated with the hypergraph (e.g., based on the hypergraph data). In an aspect, the quantum circuit graph decomposition process 404 can perform an integer programming process (e.g., integer programming optimization) to generate the set of sub-circuits 406*a-n* for the quantum circuit description 402. In an aspect, the sub-circuit 406*a* can correspond to a first portion of the hypergraph, the sub-circuit 406*n* can correspond to a second portion of the hypergraph, etc.

In certain embodiments, the quantum circuit graph decomposition process 404 can employ classical computation data 408. For example, the classical computation data 408 can include information regarding classical computation performed by one or more machines (e.g., one or more processors) associated with one or more simulation processes for the set of sub-circuits 406*a-n*. In one example, the classical computation data 408 can include information regarding one or more machines (e.g., one or more processors) that are employed to perform one or more simulation processes associated with the set of sub-circuits 406*a-n*. Additionally or alternatively, the classical computation data 408 can include information regarding an amount of memory employed by one or more machines (e.g., one or more processors) that are employed to perform one or more simulation processes associated with the set of sub-circuits 406*a-n*. In an aspect, the quantum circuit graph decomposition process 404 can generate the graphical data, the hypergraph data and/or the set of sub-circuits 406*a-n* based on the classical computation data 408. In another aspect, the quantum circuit graph decomposition process 404 can generate the graphical data, the hypergraph data and/or the set of sub-circuits 406*a-n* within storage capacity bounds indicated by the classical computation data 408.

In another embodiment, a set of tensor slice processes 410*a-n* can be performed based on the set of sub-circuits 406*a-n*. For example, the tensor slice process 410*a* can be performed for the sub-circuit 406*a*, the tensor slice process 410*n* can be performed for the sub-circuit 406*n*, etc. The set of tensor slice processes 410*a-n* can be, for example, a set of tensor slice computations. In certain embodiments, the set of tensor slice processes 410*a-n* can be performed based on the classical computation data 408. For example, the set of tensor slice processes 410*a-n* can be performed based on storage capacity bounds indicated by the classical computation data 408. In an aspect, the set of tensor slice processes 410*a-n* can include dividing a tensor and/or one or more hyperedges associated with the set of sub-circuits 406*a-n* to, for example, reduce storage requirements for one or more simulation processes associated with the quantum circuit description 402. In certain embodiments, a post-integration process 412 can integrate information associated with the set of tensor slice processes 410*a-n* to facilitate one or more simulation processes for the quantum circuit description 402. In an embodiment the set of sub-circuits 406*a-n* can be integrated to form a final circuit for one or more simulation processes for the quantum circuit description 402.

Figure 5:
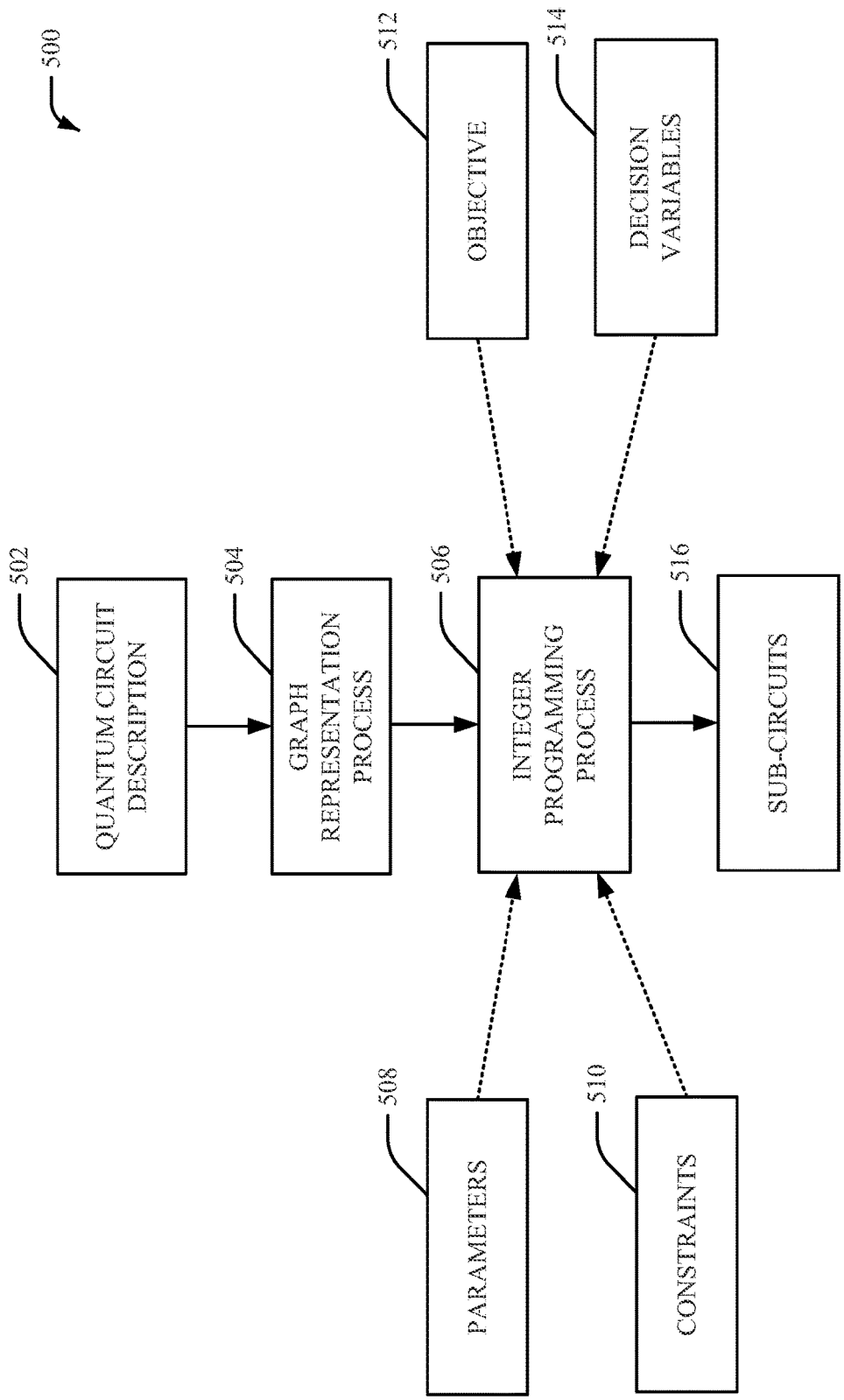
FIG. 5 illustrates another example, non-limiting system associated with quantum circuit decomposition in accordance with one or more embodiments described herein.

FIG. 5 illustrates a block diagram of an example, non-limiting system 500 in accordance with one or more embodiments described herein. Repetitive description of like elements employed in other embodiments described herein is omitted for sake of brevity.

The system 500 can include a quantum circuit description 502. In an embodiment, the quantum circuit description 502 can correspond to the quantum circuit description 302 and/or the quantum circuit description 402. The quantum circuit description 502 can be a description of a machine that performs a set of calculations based on principle of quantum physics. For example, the quantum circuit description 502 can be associated with a text-format language (e.g., a QASM text-format language) that describes a quantum circuit. In an aspect, a quantum circuit associated with the quantum circuit description 502 can encode and/or process information using qubits. In one embodiment, a quantum circuit associated with the quantum circuit description 502 can be a quantum processor (e.g., a hardware quantum processor) that can encode and/or process information using qubits. For instance, a quantum circuit associated with the quantum circuit description 502 can be a hardware quantum processor that executes a set of instruction threads associated with qubits. In another embodiment, a quantum circuit associated with the quantum circuit description 502 can be a qubit device and/or a qubit unit cell that can encode and/or process information using qubits. For instance, a quantum circuit associated with the quantum circuit description 502 can be a qubit device and/or a qubit unit cell that executes a set of instruction threads associated with qubits. In an aspect, the quantum circuit description 502 can include one or more quantum elements. The one or more quantum elements can include, for example, a qubit element of a quantum circuit associated with the quantum circuit description 502, a coupler of a quantum circuit associated with the quantum circuit description 502, a readout of a quantum circuit associated with the quantum circuit description 502, a bus of a quantum circuit associated with the quantum circuit description 502, and/or another quantum element of a quantum circuit associated with the quantum circuit description 502.

A graph representation process 504 can be performed based on the quantum circuit description 502. In one example, the graph representation process 504 can correspond to at least a portion of a quantum circuit graph decomposition process (e.g., the quantum circuit graph decomposition process 404). The graph representation process 504 can be performed, for example, by the quantum circuit decomposition component 104. In an embodiment, the graph representation process 504 can generate a graphical representation of the quantum circuit description 502. For instance, the graph representation process 504 can generate graphical data for the quantum circuit description 502. The graphical representation of the quantum circuit description 502 can be formatted as a hypergraph of the quantum circuit description 502. For example, the graph representation process 504 can graphically represent the quantum circuit description 502 as a hypergraph. In an aspect, the graphical data can include hypergraph data. The hypergraph data can be indicative of a hypergraph representation of the quantum circuit description 502. In another aspect, the graph representation process 504 can generate a set of nodes and a set of hyperedges for the hypergraph. The set of nodes can be a set of vertices (e.g., a set of points) of the hypergraph. The set of hyperedges can be a set of edges that connect two or more nodes from the set of nodes. In one example, a node of the hypergraph can represent a tensor associated with the quantum circuit description 502. For instance, a gate of the quantum circuit description 502 can be represented as a node associated with a tensor in the hypergraph. A tensor can be an element of a tensor product of a finite number of vector spaces over a common field. As such, a tensor can be a multilinear map for a gate of the quantum circuit description 502. In certain embodiments, the graph representation process 504 can convert tensor data indicative of information for a tensor network representative of the quantum circuit description 502 into the hypergraph data. For instance, the tensor network can be a set of tensors where at least a portion of indices for the set of tensors are modified based on a defined pattern. The tensor network can, for example, be represented as an undirected graph where a node corresponds to a tensor and an edge represents a reduction among common indices of connected nodes.

Based on the graph representation process 504, an integer programming process 506 can be performed. In one example, the integer programming process 506 can correspond to at least another portion of a quantum circuit graph decomposition process (e.g., the quantum circuit graph decomposition process 404). For instance, a quantum circuit graph decomposition process (e.g., the quantum circuit graph decomposition process 404) can include the graph representation process 504 and/or the integer programming process 506. The integer programming process 506 can be, for example, an integer programming optimization process. In an aspect, a set of inputs for the integer programming process 506 can be constructed based on the graph representation process 504. For example, the set of inputs for the integer programming process 506 can be constructed based on the graphical data and/or the hypergraph data generated by the graph representation process 504. In an embodiment, the graph representation process 504 can determine parameters 508, constraints 510, an objective 512 and/or decision variables 514. Furthermore, the parameters 508, the constraints 510, the objective 512 and/or the decision variables 514 can be provided as a set of inputs for the integer programming process 506. In an aspect, the integer programming process 506 can modify one or more variables of the graphical data and/or the hypergraph data generated by the graph representation process 504 into an integer. The parameters 508 can include information associated with a number of computation steps for the integer programming process 506, a number of sub-circuits contracted in a computation step for the integer programming process 506, a maximum number of sub-circuits in a partition of the hypergraph, a maximum number of sliced edges, and/or one or more other parameters. The constraints 510 can include information associated with a relationship between a node and a sub-circuit, a memory cost for a sub-circuit, a slicing of a hyperedge, and/or one or more other constraints. For instance, the constraints 510 can be a set of constraints on the decision variables 514 to, for example, ensure that graph decomposition of the quantum circuit 500 yields a simulation strategy for the quantum circuit 500 that satisfies a defined criterion. In certain embodiments, the constraints 510 can impose limits on memory implied by the graph decomposition of the quantum circuit 500. The objective 512 can include information associated with an objective function for the integer programming process 506. For example, objective 512 can indicate a quality of graph decomposition of the quantum circuit 500 to minimize or maximize memory (e.g., minimize primary storage (RAM) or secondary storage (disk memory)) for one or more tensors created by graph decomposition of the quantum circuit 500. The decision variables 514 can include one or more decisions associated with modifying the graphical data and/or the hypergraph data. For instance, the decision variables 514 can be variables to indicate to which sub-circuit one or more nodes belongs, variables to compute a rank of tensors involved in a simulation process for the quantum circuit description 502, variables to represent an order of computation during a simulation process for the quantum circuit description 502, etc. In an example, the decision variables 514 can be associated with a decision to add a rank to a portion of the hypergraph based on a hyperedge, a decision to slice a portion of the hypergraph, a decision based on a relationship between a hyperedge and a node of the hypergraph, and/or one or more other decision variables. Sub-circuits 516 can be generated based on the graph representation process 504 and/or the integer programming process 506. The sub-circuits 516 can, for example, correspond to the set of sub-circuits 406*a-n*. In certain embodiments, one or more simulation processes for the quantum circuit description 502 can be performed based on the sub-circuits 516.

Figure 6:
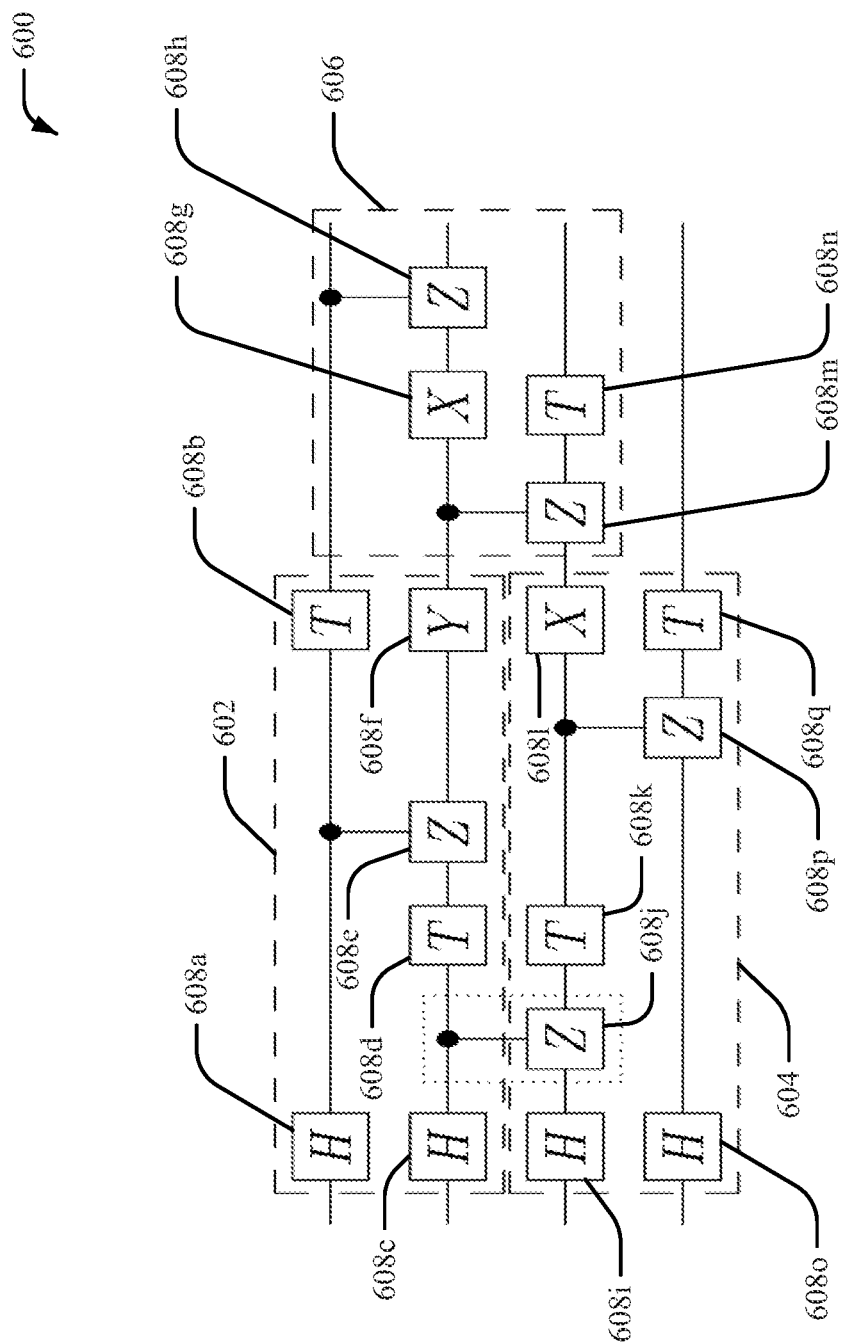
FIG. 6 illustrates an example, non-limiting system associated with a quantum circuit in accordance with one or more embodiments described herein.

FIG. 6 illustrates a block diagram of an example, non-limiting quantum circuit 600 in accordance with one or more embodiments described herein. Repetitive description of like elements employed in other embodiments described herein is omitted for sake of brevity.

The quantum circuit 600 can be divided into a sub-circuit 602, a sub-circuit 604 and a sub-circuit 606. In an embodiment, the sub-circuit 602, the sub-circuit 604 and the sub-circuit 606 can be determined by the quantum circuit decomposition component 104. Furthermore, the quantum circuit 600 can include a set of gates 608*a-q*. In an aspect, the sub-circuit 602 can include the set of gates 608*a-f*, the sub-circuit 604 can include the set of gates 608*i-l* and the set of gates 608*o-q*, and the sub-circuit 606 can include the set of gates 608*g-h* and the set of gates 608*m-n*. In an embodiment, the gate 608*a*, the gate 608*c*, the gate 608*i* and the gate 608*o* can be a first type of gate (e.g., a Hadamard gate) that acts on a single qubit. Furthermore, the gate 608*b*, the gate 608*d*, the gate 608*k*, the gate 608*n* and the gate 608*q* can be a second type of gate (e.g., a Toffoli gate) that corresponds to a three-qubit gate. Additionally, the gate 608*e*, the gate 608*h*, the gate 608*j*, the gate 608*m* and the gate 608*p* can be a third type of gate (e.g., a Pauli-Z gate) that acts on a single qubit. Moreover, the gate 608*f* can be a fourth type of gate (e.g., a Pauli-Y gate) that acts on a single qubit. In certain embodiments, the set of gates 608*a-q* can be represented as a set of tensors. In an embodiment, the quantum circuit 600 can be a 4×1-qubit quantum circuit with 9 layers of gates. In certain embodiments, the sub-circuit 602, the sub-circuit 604 and the sub-circuit 606 can be determined based on one or more heuristic partitioning techniques.

Figure 7:
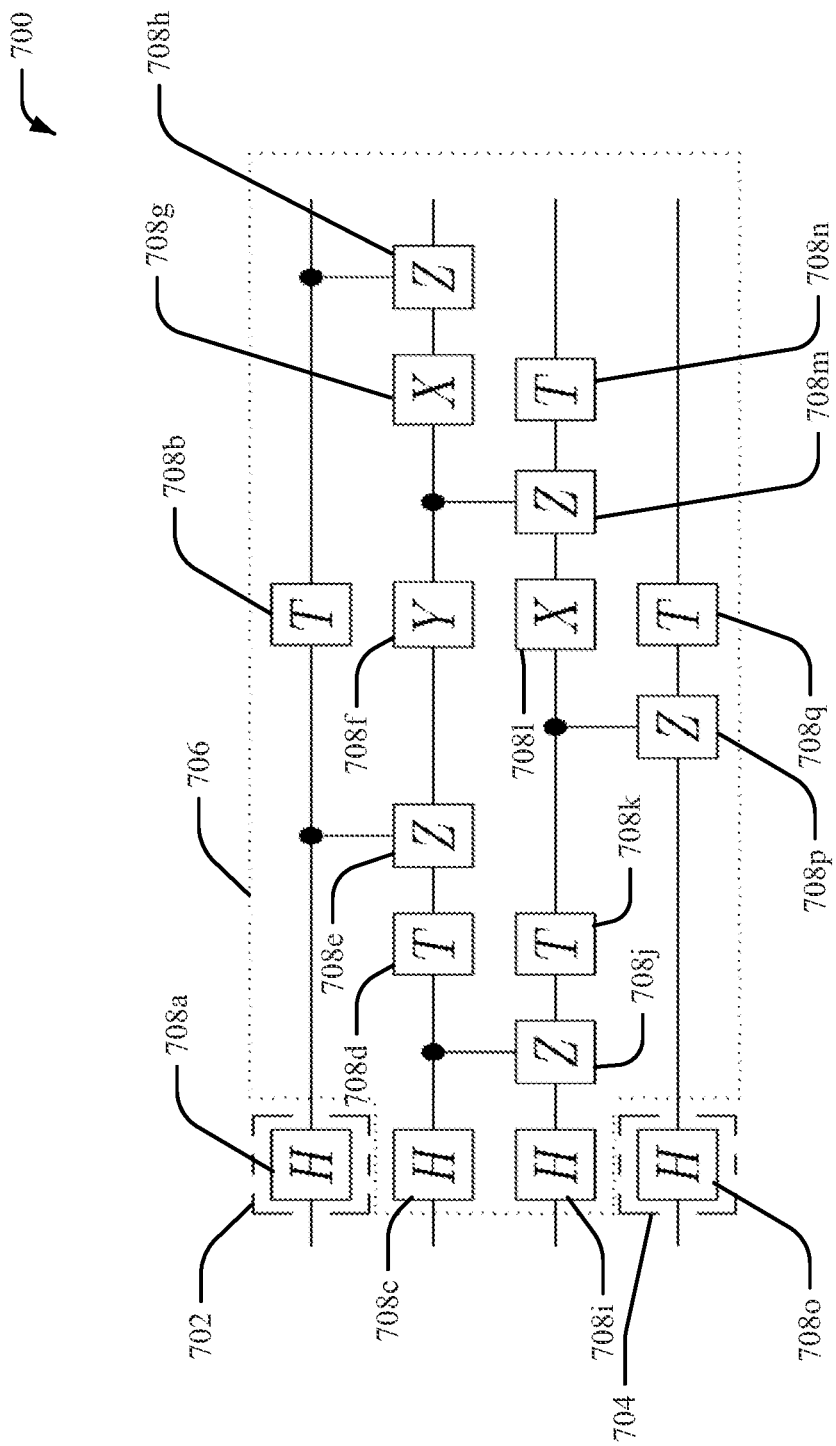
FIG. 7 illustrates another example, non-limiting system associated with a quantum circuit in accordance with one or more embodiments described herein.

FIG. 7 illustrates a block diagram of an example, non-limiting quantum circuit 700 in accordance with one or more embodiments described herein. Repetitive description of like elements employed in other embodiments described herein is omitted for sake of brevity.

The quantum circuit 700 can be divided into a sub-circuit 702, a sub-circuit 704 and a sub-circuit 706. In an embodiment, the sub-circuit 702, the sub-circuit 704 and the sub-circuit 706 can be determined by the quantum circuit decomposition component 104. Furthermore, the quantum circuit 700 can include a set of gates 708*a-q*. In an aspect, the sub-circuit 702 can include the gate 708*a*, the sub-circuit 704 can include the gate 708*o*, and the sub-circuit 706 can include the set of gates 708*b-n* and the set of gates 708*p-n*. In an embodiment, the gate 708*a*, the gate 708*c*, the gate 708*i* and the gate 708*o* can be a first type of gate (e.g., a Hadamard gate) that acts on a single qubit. Furthermore, the gate 708*b*, the gate 708*d*, the gate 708*k*, the gate 708*n* and the gate 708*q* can be a second type of gate (e.g., a Toffoli gate) that corresponds to a three-bit gate. Additionally, the gate 708*e*, the gate 708*h*, the gate 708*j*, the gate 708*m* and the gate 708*p* can be a third type of gate (e.g., a Pauli-Z gate) that acts on a single qubit. Moreover, the gate 708*f* can be a fourth type of gate (e.g., a Pauli-Y gate) that acts on a single qubit. In certain embodiments, the set of gates 708*a-q* can be represented as a set of tensors. In an embodiment, the quantum circuit 700 can be a 4×1-qubit quantum circuit with a depth of 15. Furthermore, the quantum circuit 700 can be contracted to 9 layers. In certain embodiments, the sub-circuit 702, the sub-circuit 704 and the sub-circuit 706 can be determined based on one or more partitioning techniques.

Figure 8:
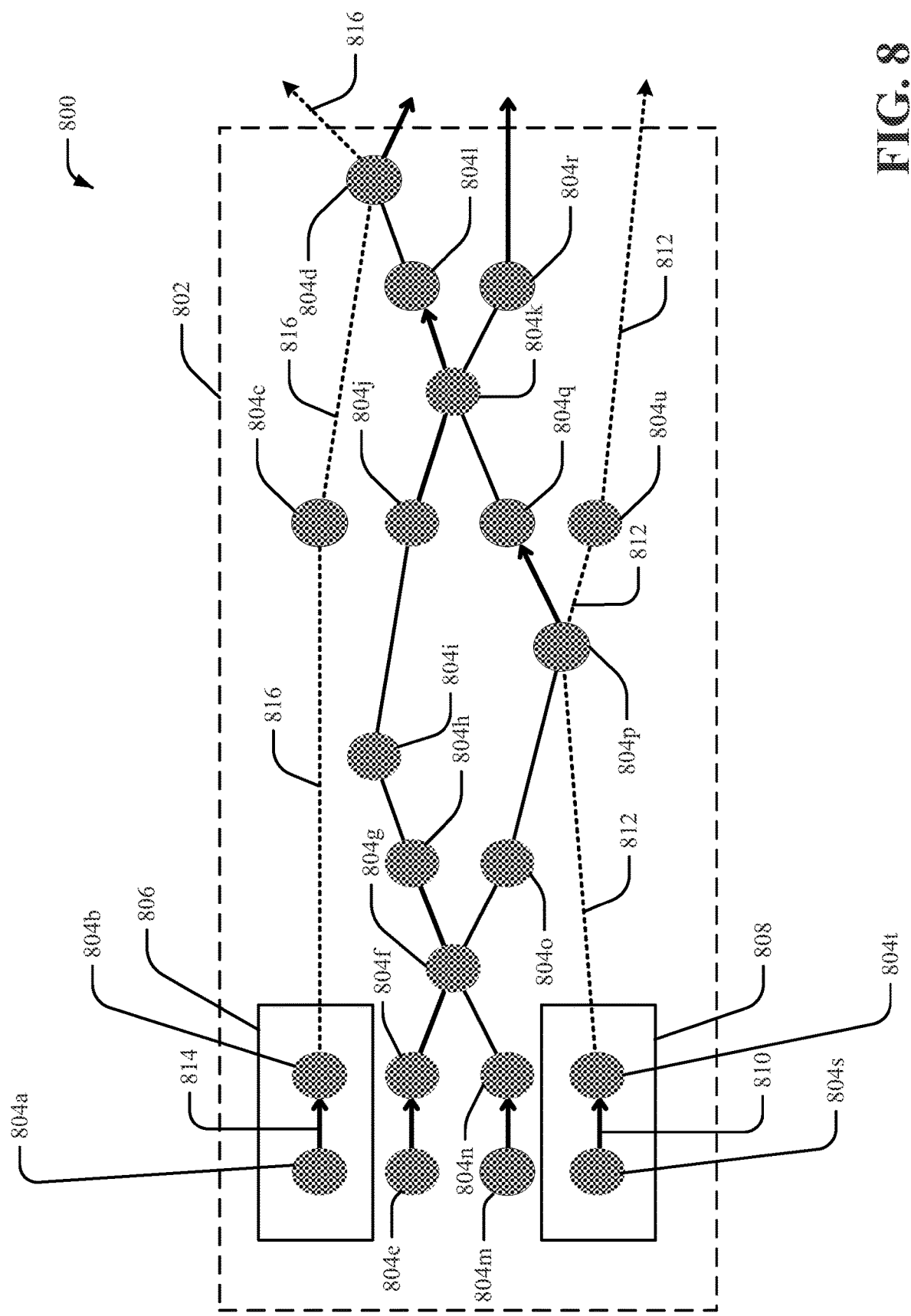
FIG. 8 illustrates an example, non-limiting system associated with a graphical representation of a quantum circuit in accordance with one or more embodiments described herein.

FIG. 8 illustrates a block diagram of an example, non-limiting system 800 in accordance with one or more embodiments described herein. Repetitive description of like elements employed in other embodiments described herein is omitted for sake of brevity.

The system 800 includes a hypergraph 802. The hypergraph 802 can be a hypergraph that corresponds to a graphical representation of a quantum circuit. In an example, the hypergraph 802 can be a hypergraph that corresponds to a graphical representation of the quantum circuit 600 and/or the quantum circuit 700. The hypergraph 802 can include a set of nodes 804*a-u*. In an embodiment, a set of gates included in a quantum circuit can be represented as a set of nodes associated with a tensor in the hypergraph 802. For example, the set of gates 608*a-q* included in the quantum circuit 600 can be represented as the set of nodes 804*a-u* in the hypergraph 802. In another example, the set of gates 708*a-q* included in the quantum circuit 700 can be represented as the set of nodes 804*a-u* in the hypergraph 802. In an aspect, the set of nodes 804*a-b* in a grouping 806 and the set of nodes 804*s-t* in a grouping 808 can represent a set of tensors of rank 1 associated with a vector. The set of nodes 804*a-b* in the grouping 806 and the set of nodes 804*s-t* in the grouping 808 can additionally or alternatively represent an initial state of a qubit. Furthermore, the set of nodes 804*c-r* and the nodes 804*u* can represent a set of tensors of rank 2 associated with an N×N matrix, where N is an integer. In another aspect, one or more nodes from the set of nodes 804*a-u* can correspond to a single-qubit gate. Additionally or alternatively, one or more nodes from the set of nodes 804*a-u* can correspond to a two-qubit gate. In another aspect, one or more nodes from the set of nodes 804*a-u* can correspond to a three-qubit gate. In one example, one or more nodes from the set of nodes 804*a-u* can correspond to a gate acting on an arbitrary number of qubits.

In another embodiment, the hypergraph 802 can include a set of edges and/or a set of hyperedges. In the hypergraph 802, nodes from the set of nodes 804*a-u* can be connected with edges that have wires in common in a quantum circuit representation of the hypergraph 802. For instance, if a wire connects two gates in a quantum circuit, an edge can be created in the hypergraph 802 between corresponding two nodes in the hypergraph 802. Edges in the hypergraph 802 can correspond to lines with arrows. Furthermore, hyperedges in the hypergraph 802 can be lines in the hypergraph 802 without arrows. Hyperedges in the hypergraph 802 can bypass one or more nodes in the hypergraph 802 based on corresponding connections in a quantum circuit representation of the hypergraph 802. For instance, hyperedges in the hypergraph 802 can bypass one or more nodes in the hypergraph 802 based on corresponding connections in a quantum circuit representation of the hypergraph 802 if corresponding nodes in the hypergraph 802 are diagonal gates (e.g., if corresponding nodes in the hypergraph 802 are CZ gates). In an example, the hypergraph 802 can include an edge 810 between the node 804*s* and the node 804*t*. Furthermore, the hypergraph 802 can include a hyperedge 812 that connects the node 804*t*, the node 804*p*, and the node 804*u*. For example, the gate 608*p* and the gate 608*q* in the quantum circuit 600 can be connected as diagonal gates where the gate 608*p* includes three wire connections and the gate 608*q* includes two wire connections. Similarly, the gate 708*p* and the gate 708*q* in the quantum circuit 700 can be connected as diagonal gates where the gate 708*p* includes three wire connections and the gate 708*q* includes two wire connections. As such, the hyperedge 812 in the hypergraph 802 can bypass the node 804*p* and the node 804*u*. In another example, the hypergraph 802 can include an edge 814 between the node 804*a* and the node 804*b*. Furthermore, the hypergraph 802 can include a hyperedge 816 that connects the node 804*b*, the node 804*c*, and the node 804*d*. In certain embodiments, the hypergraph 802 can be employed by an integer programming process to facilitate simulation of a quantum circuit.

In certain embodiments, a node in a given layer of the hypergraph 802 can represent a tensor and a hyperedge can represent an index label for the tensor. In one example, a portion of a decomposition of a tensor product can be assigned with a tensor (e.g., a tensor visualization) where a number of tensors (e.g., a number of different visualizations) is bounded based on computational limitations and/or memory limitations for one or more simulation process associated with a quantum circuit that corresponds to the hypergraph 802. A visualization index (e.g., RGB index) for a tensor can be fixed. Alternatively, a visualization index (e.g., RGB index) for a tensor can be modified based on a next step of a computation sequence. Hyperedges in the hypergraph 802 can contain vertices with different visualizations based on memory requirements for one or more simulation process associated with a quantum circuit that corresponds to the hypergraph 802. In an embodiment, a set of tensors that correspond to a same computation step can be computed together based on a defined order. Furthermore, a memory requirement for one or more simulation process associated with a quantum circuit that corresponds to the hypergraph 802 can be determined based on partitioning of the hypergraph 802. As such memory cost and/or computation cost to perform one or more simulation process associated with a quantum circuit that corresponds to the hypergraph 802 can be reduced.

Figure 9:
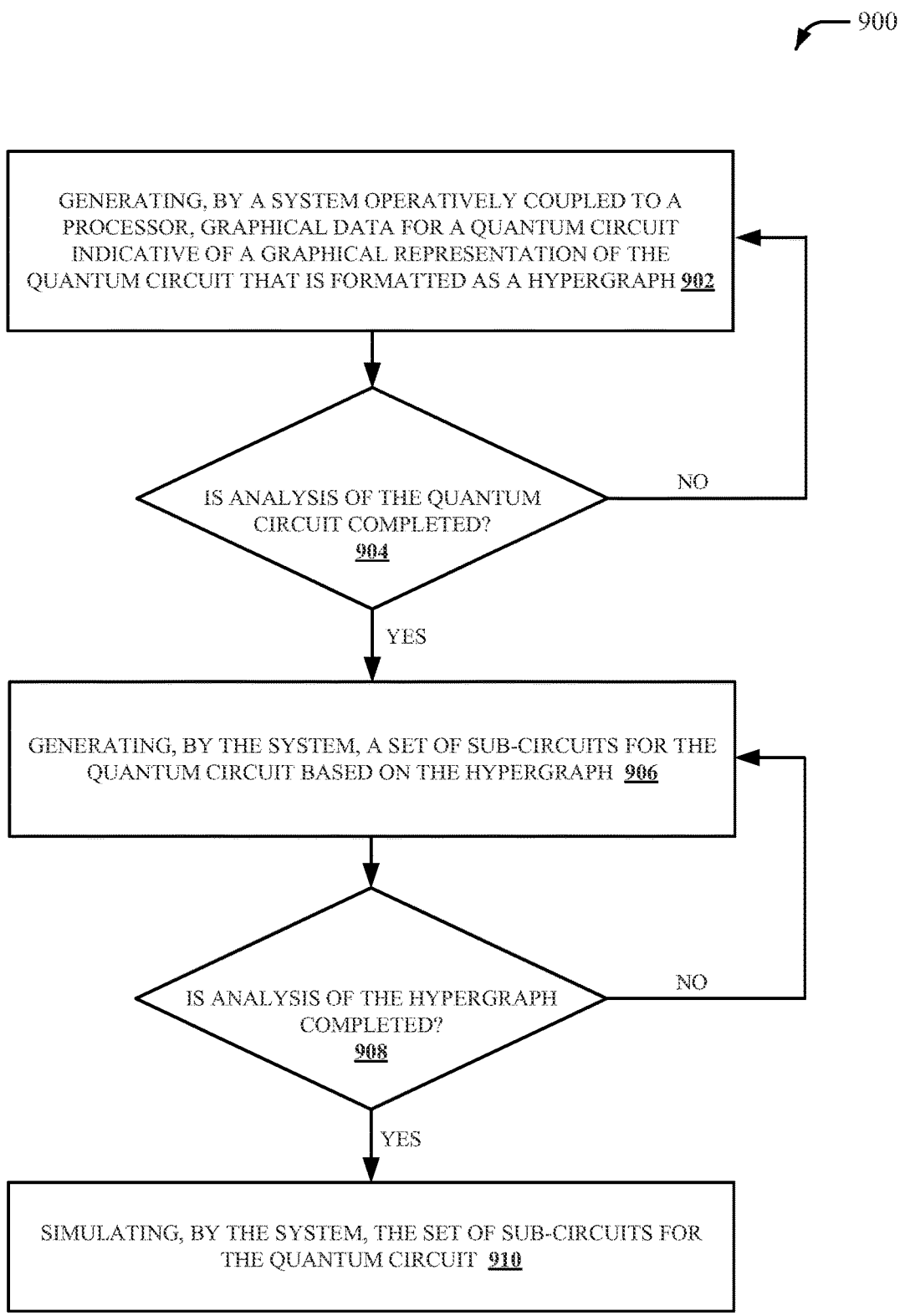
FIG. 9 illustrates a flow diagram of an example, non-limiting computer-implemented method for facilitating quantum computing simulation in accordance with one or more embodiments described herein.

FIG. 9 illustrates a flow diagram of an example, non-limiting computer-implemented method 900 for facilitating quantum computing simulation in accordance with one or more embodiments described herein. At 902, graphical data for a quantum circuit indicative of a graphical representation of the quantum circuit that is formatted as a hypergraph is generated, by a system operatively coupled to a processor (e.g., by quantum circuit decomposition component 104). The hypergraph for the quantum circuit can include a set of nodes and a set of hyperedges. The set of nodes can be a set of vertices (e.g., a set of points) of the hypergraph. The set of hyperedges can be a set of edges that connect two or more nodes from the set of nodes. In an embodiment, the graphical data can be generated by converting tensor data indicative of information for a tensor network representative of the quantum circuit into the graphical data. In an aspect, a gate of the quantum circuit can be represented as a node in the hypergraph. For example, a node in the hypergraph can be configured to represent a gate of the quantum circuit. In another aspect, a connection of the quantum circuit can be represented as a hyperedge in the hypergraph. For example, a hyperedge in the hypergraph can be configured to represent a connection of the quantum circuit.

At 904, it is determined whether analysis of the quantum circuit is completed. If no, the computer-implemented method 900 returns to 902 to generate additional graphical data. If yes, the computer-implemented method 900 proceeds to 906.

At 906, a set of sub-circuits for the quantum circuit is generated, by the system (e.g., by quantum circuit decomposition component 104), based on the hypergraph. Different sub-circuits from the set of sub-circuits can correspond to different portions of the hypergraph (e.g., different portions of the quantum circuit. For example, a first sub-circuit from the set of sub-circuits can correspond to a first portion of the hypergraph, a second sub-circuit from the set of sub-circuits can correspond to a second portion of the hypergraph, a third sub-circuit from the set of sub-circuits can correspond to a third portion of the hypergraph etc. In certain embodiments, an integer programming process associated with the graphical data can be performed to facilitate generation of the set of sub-circuits.

At 908, it is determined whether analysis of the hypergraph is completed. If no, the computer-implemented method 900 returns to 906 to generate additional data for the hypergraph and/or to further modify the hypergraph. If yes, the computer-implemented method 900 proceeds to 910.

At 910, the set of sub-circuits for the quantum circuit is simulated by the system (e.g., by simulation component 106). For instance, the set of sub-circuits can be simulated based on one or more simulation processes. In one example, a first simulation process associated with a first sub-circuit from the set of sub-circuits that corresponds to a first portion of the hypergraph can be performed, a second simulation process associated with a second sub-circuit from the set of sub-circuits that corresponds to a second portion of the hypergraph can be performed, etc. In certain embodiments, different amounts of memory and/or different amount of computing resources can be employed for different sub-circuits from the set of sub-circuits during the one or more simulation processes associated with the set of sub-circuits. In an embodiment, simulation data for the quantum circuit can be generated based on simulation of the set of sub-circuits.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Moreover, because at least generating graphical data and/or simulating a set of sub-circuits, etc. are established from a combination of electrical and mechanical components and circuitry, a human is unable to replicate or perform processing performed by the quantum circuit simulation component 102 (e.g., the quantum circuit decomposition component 104, the simulation component 106, and/or the hypergraph component 202) disclosed herein. For example, a human is unable to generate simulation data for a quantum circuit, etc.

Figure 10:
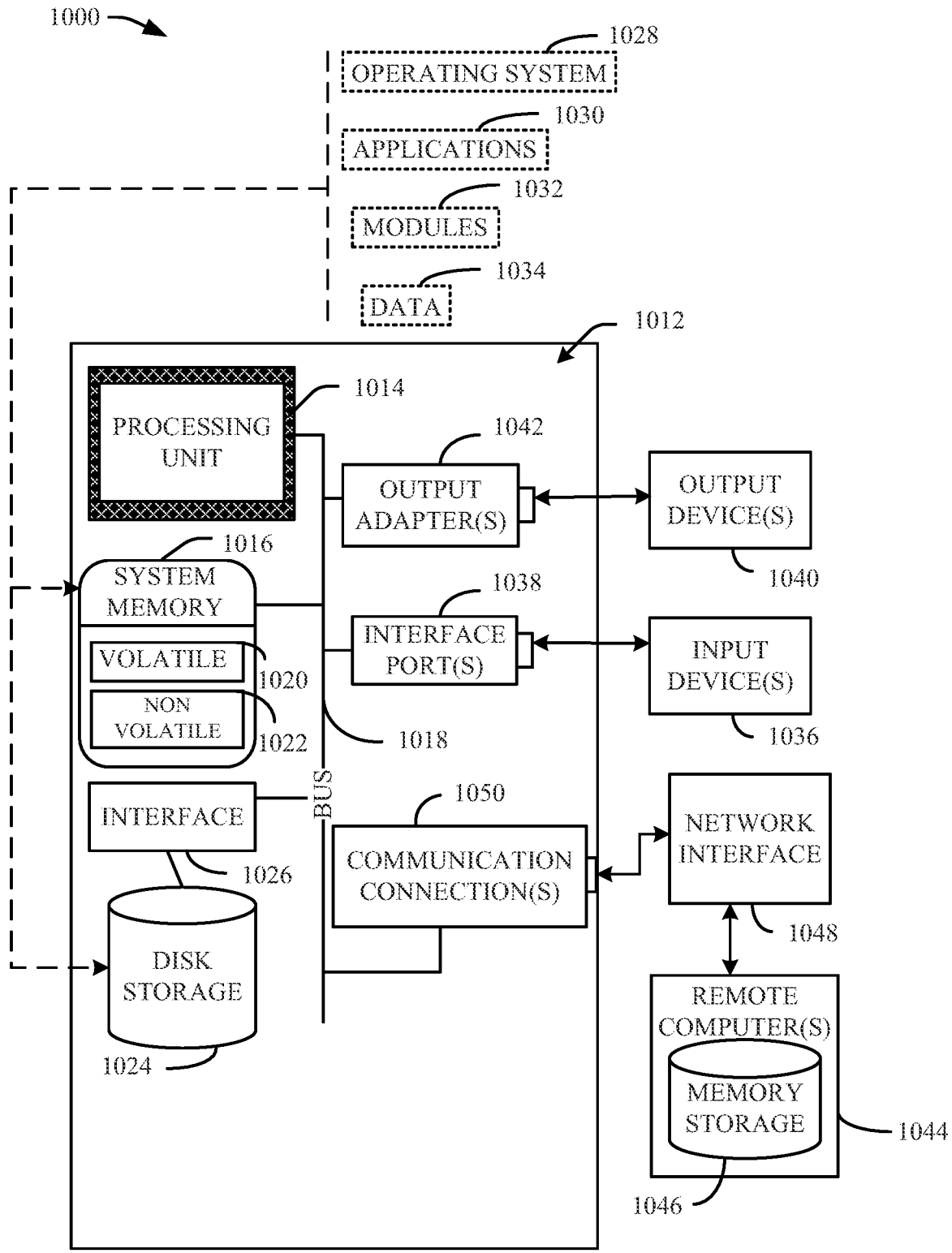
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a memory that stores computer executable components; and
   a processor that executes computer executable components stored in the memory, wherein the computer executable components comprise:
      a quantum circuit decomposition component that:
         generates graphical data for a quantum circuit, wherein a graphical representation of the quantum circuit is formatted as a hypergraph and a gate of the quantum circuit is represented as a node associated with a tensor in the hypergraph; and
         alters a visualization index of the tensor based on a computation sequence for a simulation process associated with the quantum circuit.

2. The system of claim 1, wherein the quantum circuit decomposition component generates a set of sub-circuits for the quantum circuit based on the graphical data associated with the hypergraph, and wherein the visualization index comprises a red green blue (RGB) index.

3. The system of claim 2, further comprising a simulation component that simulates the set of sub-circuits.

4. The system of claim 1, wherein the tensor is a multi-linear map for the gate of the quantum circuit.

5. The system of claim 1, wherein a hyperedge of the hypergraph represents an index label for the tensor.

6. The system of claim 4, wherein the quantum circuit decomposition component partitions the hypergraph based on the computation sequence for a simulation process associated with the quantum circuit.

7. The system of claim 1, wherein the quantum circuit decomposition component performs integer programming optimization to generate a set of sub-circuits for the quantum circuit.

8. The system of claim 1, further comprising a simulation component, wherein the simulation component determines a memory requirement for a simulation process associated with the quantum circuit based on analysis of the graphical data.

9. The system of claim 1, further comprising a simulation component, wherein the simulation component simulates a first portion of the hypergraph and a second portion of the hypergraph in parallel in response to a determination that the first portion of the hypergraph and the second portion of the hypergraph are included in a corresponding computation sequence for a simulation process associated with the quantum circuit.

10. The system of claim 1, further comprising a simulation component, wherein the simulation component simulates the quantum circuit based on the graphical data associated with the hypergraph to reduce an amount of processing for a simulation process associated with the quantum circuit.

11. A computer-implemented method, comprising:
   generating, by a system operatively coupled to a processor, graphical data for a quantum circuit indicative of a graphical representation of the quantum circuit that is formatted as a hypergraph and a gate of the quantum circuit is represented as a node associated with a tensor in the hypergraph; and
   altering, by the system, a visualization index of the tensor based on a computation sequence for a simulation process associated with the quantum circuit.

12. The computer-implemented method of claim 11, wherein the generating the graphical data comprises converting tensor data indicative of information for a tensor network representative of the quantum circuit into the graphical data.

13. The computer-implemented method of claim 11, wherein the generating the graphical data comprises representing a connection of the quantum circuit as a hyperedge in the hypergraph.

14. The computer-implemented method of claim 11, further comprising:
   generating, by the system, a set of sub-circuits for the quantum circuit based on the hypergraph.

15. The computer-implemented method of claim 14, wherein the generating the set of sub-circuits comprises performing an integer programming process associated with the graphical data.

16. The computer-implemented method of claim 14, wherein the generating the set of sub-circuits comprises reducing an amount of processing for a simulation process associated with the quantum circuit.

17. A computer program product for quantum computing simulation, the computer program product comprising a computer readable storage medium having program instructions embodied therewith, the program instructions executable by a processor to cause the processor to:

generating, by the processor, graphical data for a quantum circuit indicative of a graphical representation of the quantum circuit that is formatted as a hypergraph and a gate of the quantum circuit is represented as a node associated with a tensor in the hypergraph; and alter, by the processor, a visualization index of the tensor based on a computation sequence for a simulation process associated with the quantum circuit.

18. The computer program product of claim 17, wherein the program instructions are further executable by the processor to cause the processor to:

convert, by the processor, tensor data indicative of information for a tensor network representative of the quantum circuit into the graphical data.

19. The computer program product of claim 17, wherein the program instructions are further executable by the processor to cause the processor to:

simulate, by the processor, the quantum circuit based on the graphical data associated with the hypergraph to reduce an amount of processing for a simulation process associated with the quantum circuit.

20. The computer program product of claim 17, wherein the program instructions are further executable by the processor to cause the processor to:

configure, by the processor, a hyperedge in the hypergraph to represent a connection of the quantum circuit.

* * * * *